(12) United States Patent
Hsu et al.

(10) Patent No.: US 12,532,734 B2
(45) Date of Patent: Jan. 20, 2026

(54) SEMICONDUCTOR DEVICE AND METHOD OF FABRICATING THE SAME

(71) Applicant: United Microelectronics Corp., Hsinchu (TW)

(72) Inventors: Ching-Pin Hsu, Tainan (TW); Shih Hung Yang, Tainan (TW); Chu Chun Chang, Kaohsiung (TW); Kuo-Yuh Yang, Hsinchu County (TW); Chia-Huei Lin, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 395 days.

(21) Appl. No.: 18/179,377

(22) Filed: Mar. 7, 2023

(65) Prior Publication Data

US 2024/0203785 A1    Jun. 20, 2024

(30) Foreign Application Priority Data

Dec. 14, 2022    (CN) .......................... 202211611444.X

(51) Int. Cl.
| | |
|---|---|
| *H01L 21/768* | (2006.01) |
| *H01L 23/522* | (2006.01) |
| *H01L 23/528* | (2006.01) |
| *H10D 62/10* | (2025.01) |

(52) U.S. Cl.
CPC .... *H01L 21/7682* (2013.01); *H01L 21/76832* (2013.01); *H01L 21/76834* (2013.01); *H01L 21/76877* (2013.01); *H01L 23/5222* (2013.01); *H01L 23/5283* (2013.01); *H10D 62/115* (2025.01)

(58) Field of Classification Search
CPC .............. H01L 21/7682; H01L 21/764; H01L 21/76832; H01L 21/76834; H01L 21/76877; H01L 23/5222; H01L 23/5283; H01L 23/5223; H10D 62/115
See application file for complete search history.

(56) References Cited

U.S. PATENT DOCUMENTS

| | | | |
|---|---|---|---|
| 9,831,346 B1* | 11/2017 | Zang | ................. H01L 21/28518 |
| 10,211,146 B2 | 2/2019 | He et al. | |
| 10,217,756 B2 | 2/2019 | Yang et al. | |
| 11,270,945 B2 | 3/2022 | Chang et al. | |
| 11,355,389 B2 | 6/2022 | Li et al. | |
| 2013/0295735 A1 | 11/2013 | Tsai et al. | |
| 2014/0264896 A1* | 9/2014 | Lu | ......................... H01L 23/528 257/773 |
| 2017/0330790 A1* | 11/2017 | He | ........................... H01L 23/66 |
| 2021/0242110 A1* | 8/2021 | Hsu | ................... H01L 21/02167 |
| 2021/0391262 A1* | 12/2021 | Chang | ................. H10D 64/251 |

* cited by examiner

*Primary Examiner* — Zandra V Smith
*Assistant Examiner* — John M Parker
(74) *Attorney, Agent, or Firm* — JCIPRNET

(57) ABSTRACT

A semiconductor device includes a conductive structure, a first dielectric layer, a second dielectric layer and a liner layer. The conductive structure is located on a substrate. The first dielectric layer covers the conductive structure and the substrate. The second dielectric layer is located on the first dielectric layer. An air gap is present in the first dielectric layer and the second dielectric layer, and is located above the conductive structure. The liner layer covers and surrounds a middle portion of the air gap.

8 Claims, 8 Drawing Sheets

SEMICONDUCTOR DEVICE AND METHOD OF FABRICATING THE SAME

CROSS-REFERENCE TO RELATED APPLICATION

This application claims the priority benefit of China application serial no. 202211611444.X, filed on Dec. 14, 2022. The entirety of the above-mentioned patent application is hereby incorporated by reference herein and made a part of this specification.

BACKGROUND

Technical Field

The present disclosure relates to an integrated circuit and a method of fabricating the same, and particularly relates to a semiconductor device and a method of fabricating the same.

Description of Related Art

When the trend is towards size miniaturization of a semiconductor device, the size of an electronic device is reduced with the decrease in a critical dimension (CD), and the distance between components also becomes smaller. However, when the distance between components becomes smaller, the adversely effect of the components may occur. For example, the parasitic capacitance is increased when the distance between conductive components is too close.

SUMMARY

The present disclosure provides a semiconductor device for reducing the parasitic capacitance.

The present disclosure provides a method of fabricating a semiconductor device. The method may be integrated with the existing processes and may be implemented to reduce the parasitic capacitance.

According to an embodiment of the present disclosure, a semiconductor device includes a conductive structure, a first dielectric layer, a second dielectric layer, and a liner layer. The conductive structure is located on a substrate. The first dielectric layer covers the conductive structure and the substrate. The second dielectric layer is located on the first dielectric layer. An air gap is present in the first dielectric layer and the second dielectric layer, and is located above the conductive structure. The liner layer covers and surrounds a middle portion of the air gap.

According to an embodiment of the present disclosure, a method of fabricating a semiconductor device includes the following steps. A conductive structure is formed on a substrate. A first dielectric layer is formed to cover the conductive structure and the substrate. An upper part of the first dielectric layer is removed to form a trench over the conductive structure. A widening treatment is performed to the trench to partially widen the upper part of the first dielectric layer, and a liner layer is formed on a sidewall of the widened upper part of the first dielectric layer. A middle part of the first dielectric layer is removed to deepen and widen the trench. A second dielectric layer is formed on the first dielectric layer to seal the trench and therefore form an air gap.

Based on the above, in an embodiment of the present disclosure, an air gap is formed above the conductive structure to reduce the parasitic capacitance. The manufacturing method of the semiconductor device of an embodiment of the present disclosure may be integrated with the existing processes and may be implemented to reduce the parasitic capacitance.

DESCRIPTION OF THE EMBODIMENTS

Figure 1A:
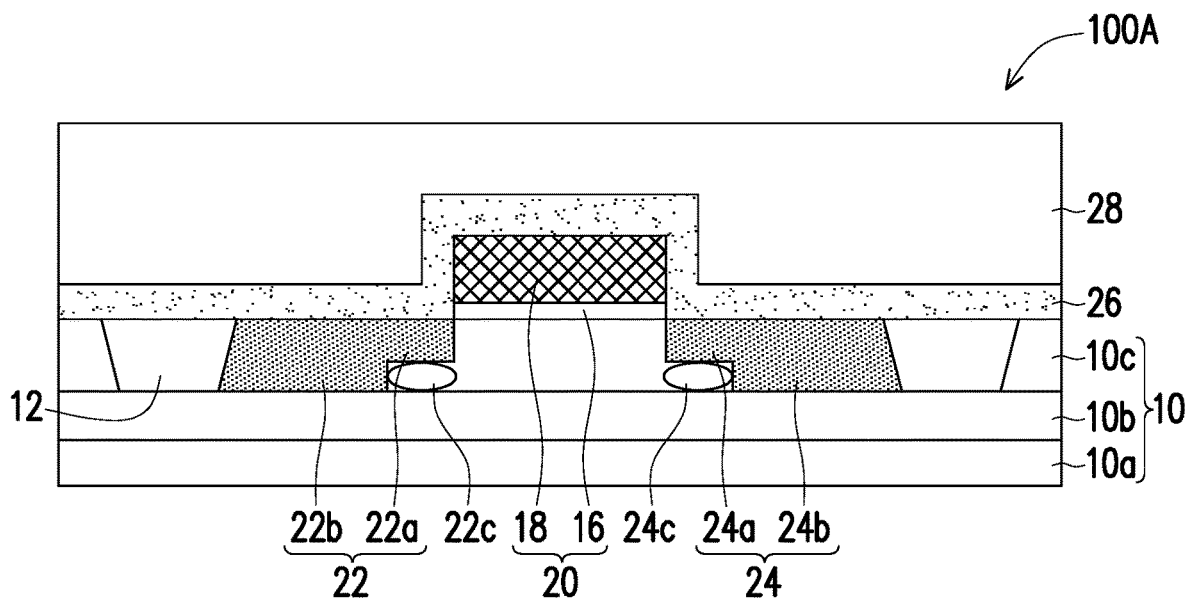
FIG. 1A to FIG. 1G are cross-sectional views of a method of fabricating a semiconductor device according to an embodiment of the present disclosure.
Figure 1B:
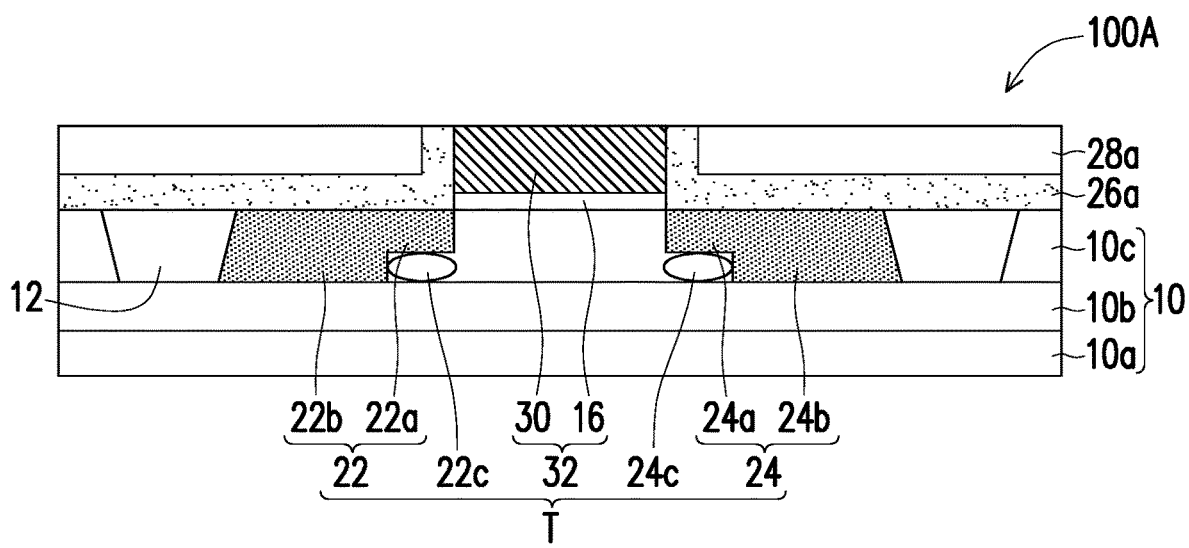
Figure 1C:
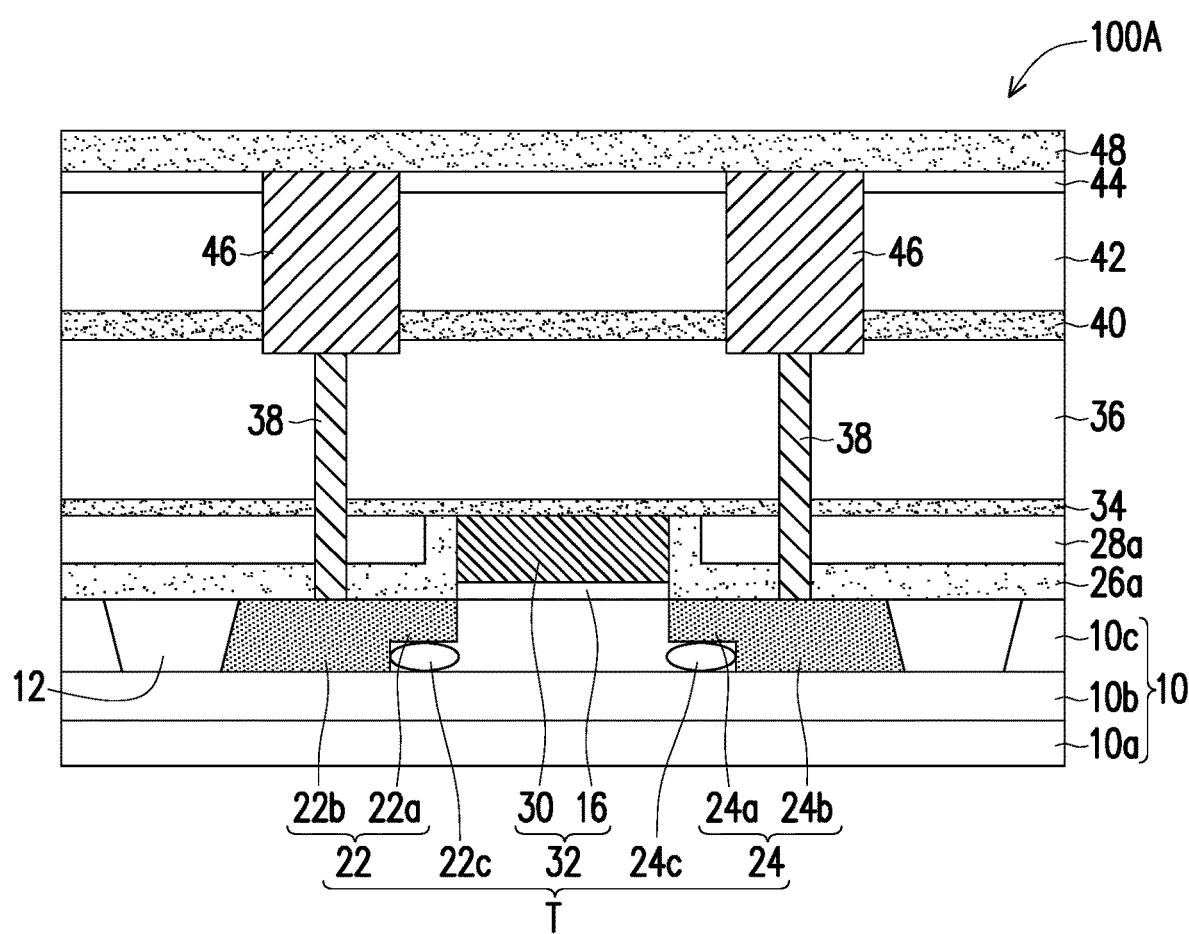
Figure 1D:
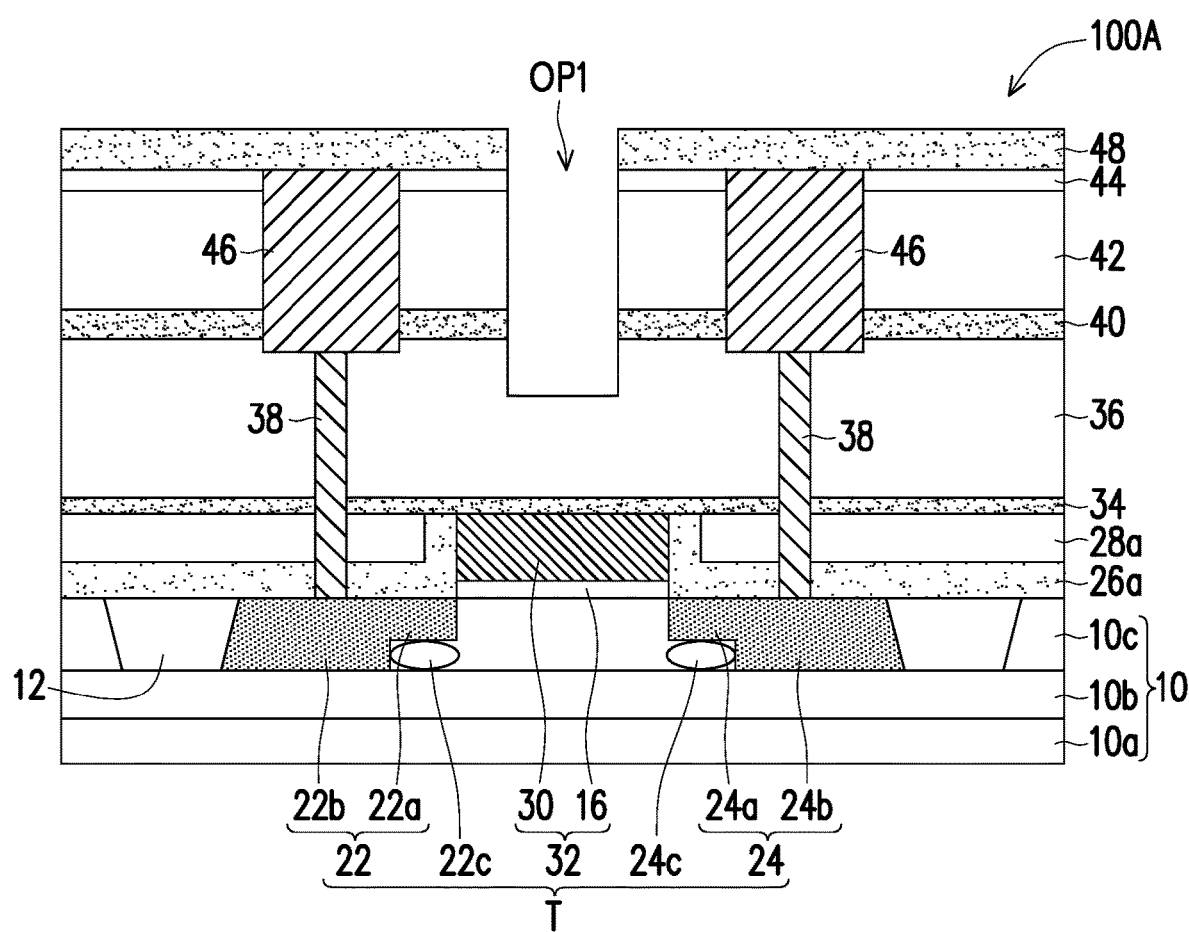
Figure 1E:
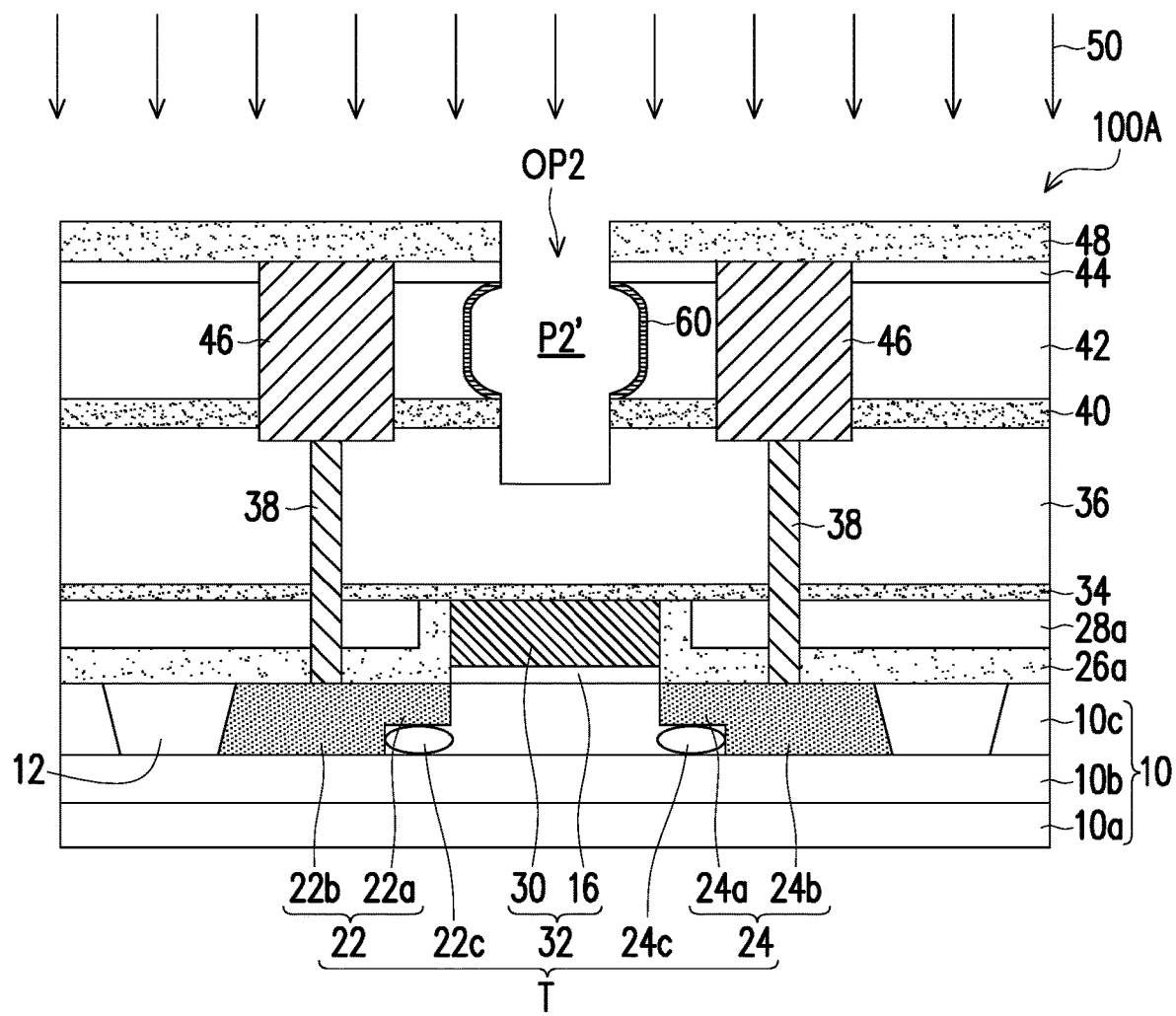
Figure 1F:
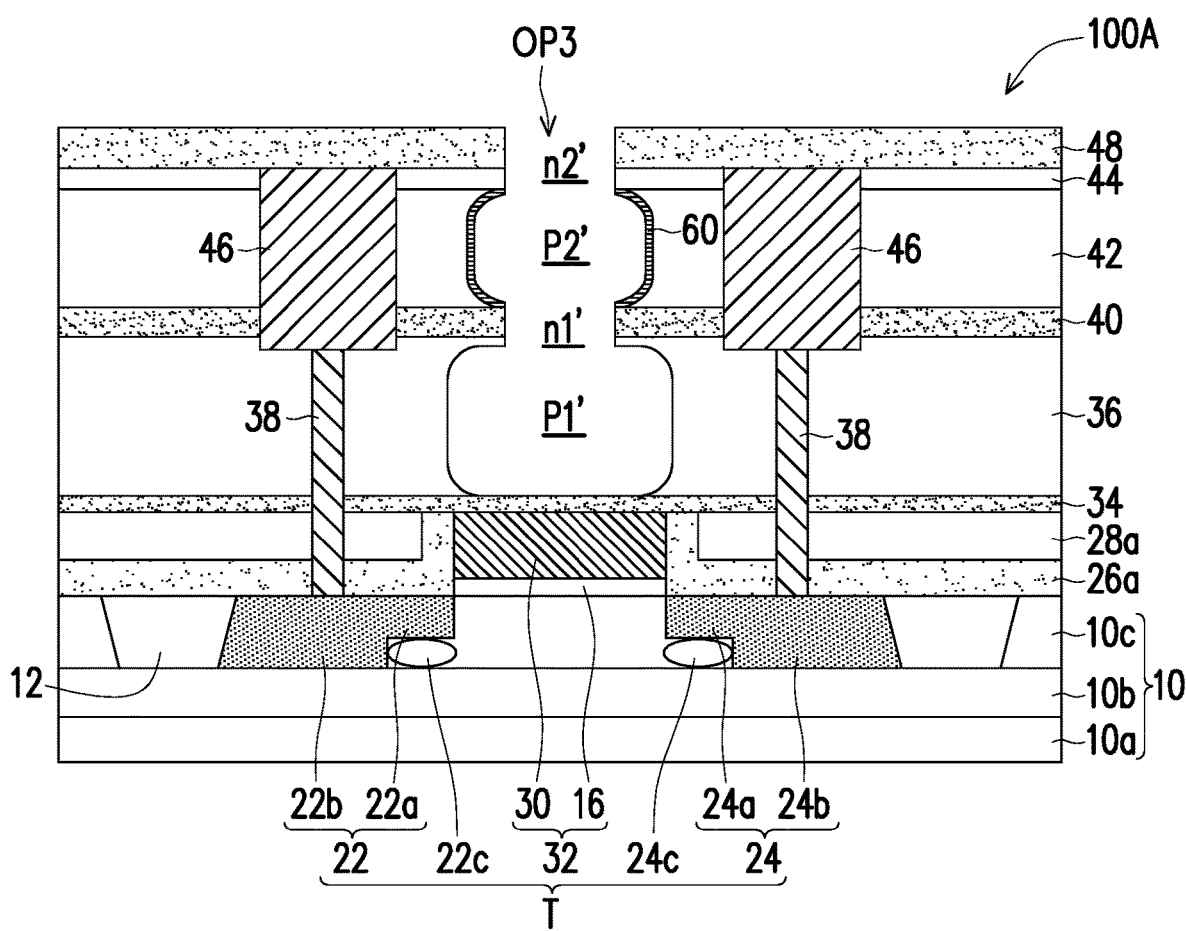
Figure 1G:
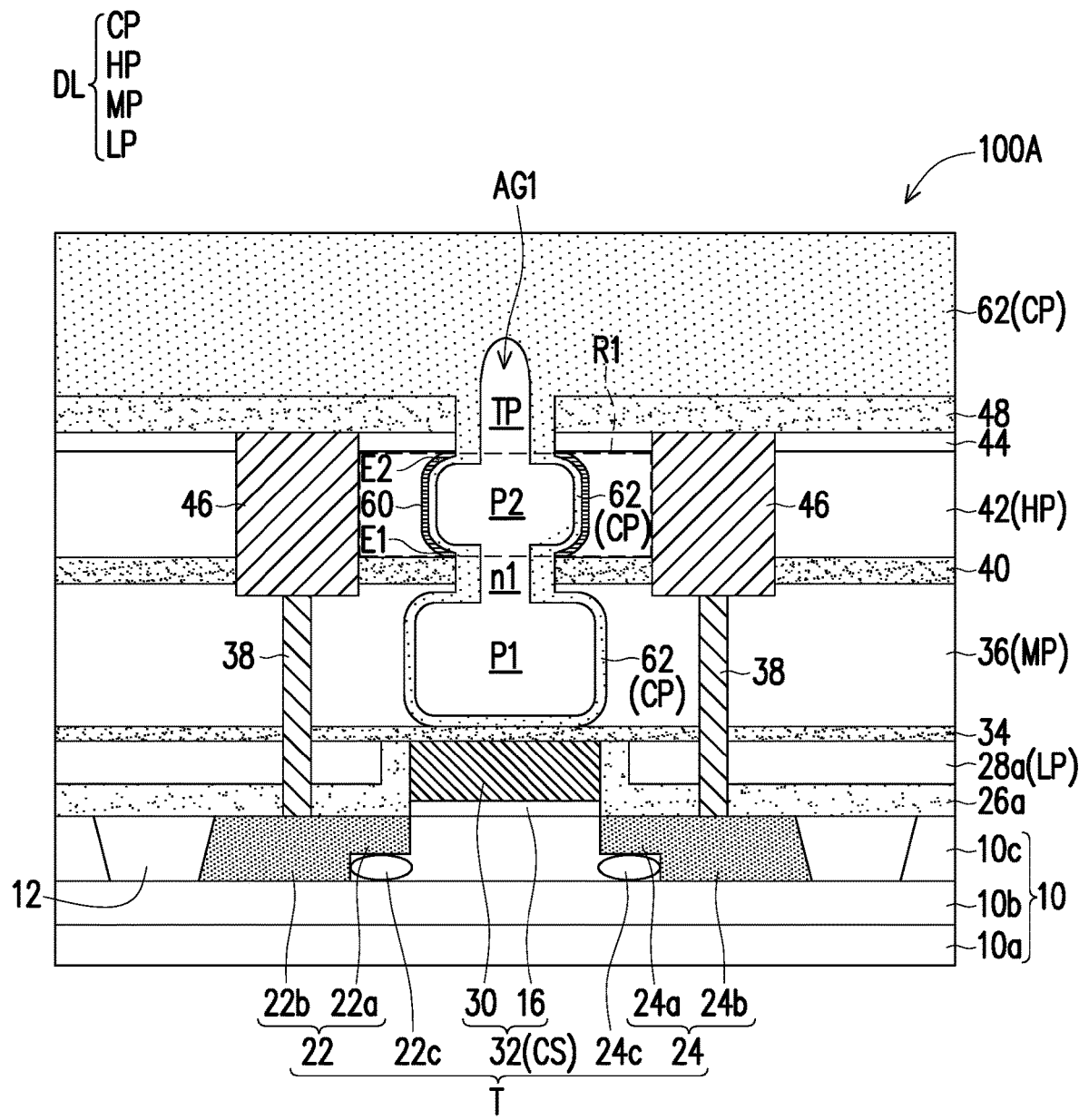

FIG. 1G is a cross-sectional view of a semiconductor device according to an embodiment of the present disclosure.

Referring to FIG. 1G, an embodiment of the present disclosure provides a semiconductor device 100A, which includes a conductive structure 32, a dielectric layer DL and a liner layer 60. The dielectric layer DL has an air gap AG1 therein.

The substrate 10 may be a semiconductor-on-insulator (SOI) substrate, or a bulk semiconductor substrate (not shown). The semiconductor-on-insulator substrate may include a semiconductor substrate 10a, an insulating layer 10b, and a semiconductor layer 10c. The semiconductor-on-insulator substrate may be a silicon-on-insulator substrate. The semiconductor substrate 10a may be a silicon substrate, the insulating layer 10b may be a silicon oxide layer, and the semiconductor layer 10c may be a silicon layer.

The conductive structure CS is located on the substrate 10. In some embodiments, the conductive structure 32 is a gate structure 32 of a transistor T. The transistor T is formed in an active area defined by an isolation structure 12. The isolation structure 12 may be a shallow trench isolation structure formed in the semiconductor layer 10c of the substrate 10.

The transistor T includes a gate structure 32, a first doped region 22 and a second doped region 24. The gate structure 32 includes a gate dielectric layer 16 and a gate conductive layer 30. The gate dielectric layer 16 may include silicon oxide, silicon nitride, a high dielectric constant material or a combination thereof. The gate conductive layer 30 is formed on the gate dielectric layer 16. The gate conductive layer 30 may include undoped polysilicon, doped polysilicon, metal, metal silicide, metal nitride or the like. The metal may include tungsten, tantalum, titanium or the like. The metal silicide may include tungsten silicide, titanium silicide or the like. The metal nitride may include tantalum nitride, titanium nitride or the like. In some embodiments, the gate structure 32 further includes a spacer (not shown) on the sidewall thereof. The spacer may have a single-layer or multi-layer structure. The material of the spacer may include silicon oxide, silicon nitride or a combination thereof.

The first doped region 22 and the second doped region 24 are located in the semiconductor layer 10c at two sides of the gate structure 32. The first doped region 22 may include a lightly doped region 22a and a heavily doped region 22b, and the second doped region 24 may include a lightly a doped region 24a and a heavily doped region 24b. In some examples, the transistor T further includes pocket-type doped regions 22c and 24c below the lightly doped regions 22a and 24a.

The dielectric layer DL covers the conductive structure 32 and the substrate 10. The material of the dielectric layer DL includes undoped glass and a low dielectric constant material. The dielectric layer DL may include a lower part LP, a middle part MP, an upper part HP, and a cap part CP. The lower part LP may include a dielectric layer 28a. The middle part MP may include a dielectric layer 36. The upper part HP may include a dielectric layer 42. The cap part CP may include a dielectric layer 62. Each of the dielectric layers 28a and 36 includes undoped glass. Each of the dielectric layers 42 and 62 includes a low dielectric constant material or an ultra-low dielectric constant material, such as a silicon-containing organic material. The low dielectric constant material is a material with a dielectric constant lower than 4. The ultra-low dielectric constant material is a material with a dielectric constant lower than that of the low dielectric constant material. The material of each of the dielectric layers 42 and 62 may include fluorine-doped silicon glass (FSG); silsesquioxides such as hydrogen silsesquioxnane (HSQ), methyl silsesquioxane (MSQ) and hybrido organo siloxane polymer (HOSP); aromatic hydrocarbon such as SiLK; organosilicate glass such as black diamond (BD), 3MS, 4MS; parylene; fluoro-polymer such as PFCB, CYTOP, Teflon; poly(arylethers) such as PAE-2, FLARE; porous polymer such as XLK, Nanofoam, Awrogel; Coral, etc.

The semiconductor device 100A further includes multiple stop layers 26a, 34, 40, 44 and 48. The stop layer 26a covers the substrate 10 and the sidewall of the gate structure 32. The stop layer 34 is located between the lower part LP and the middle part MP of the dielectric layer DL. The stop layer 40 is located between the middle part MP and the upper part HP of the dielectric layer DL. Each of the stop layers 44 and 48 is located between the upper part HP and the cap part CP of the dielectric layer DL. Each of the stop layers 26a, 34, 40, 44 and 48 may include silicon nitride, silicon oxynitride, silicon carbide (SiC), silicon carbonitride (SiCN), aluminum oxide, nitrogen doped SiC (NDC) or a combination thereof. In some embodiments, the material of the stop layer 26a includes silicon nitride formed by a high temperature chemical vapor deposition, the material of the stop layer 34 includes silicon nitride with a refractive index greater than 1.8 formed by a chemical vapor deposition, the material of the stop layer 40 includes silicon carbonitride (SiCN), the material of the stop layer 44 includes silicon oxynitride, and the material of the stop layer 48 includes nitrogen-doped SiC (NDC).

An air gap AG1 is present in the dielectric layer DL, and is located above the conductive structure 32. The air gap AG1 is in the middle part MP (dielectric layer 36), the upper part HP (dielectric layer 42) and the cap part CP (dielectric layer 62) of the dielectric layer DL.

The semiconductor device 100A further includes a metal interconnection. The metal interconnection includes at least one contact 38 and at least one conductive line 46. The contact 38 is electrically connected to the first doped region 22 and the conductive line 46, or electrically connected to the second doped region 24 and the conductive line 46. The contact 38 extends through the middle part MP (dielectric layer 36) of the dielectric layer DL, the stop layer 34, the lower part LP (dielectric layer 28a) of the dielectric layer DL and the stop layer 26a. The conductive line 46 extends through the stop layer 44, the upper part HP (dielectric layer 42) of the dielectric layer DL and the stop layer 40.

The air gap AG1 is in the shape of a multi-knotted gourd or a multi-section gourd. The air gap AG1 includes a lower portion P1, a neck portion n1, a middle portion P2 and a top portion TP. The middle portion P2 of the air gap AG1 is disposed between the lower portion P1 and the top portion TP. The neck portion n1 of the air gap AG1 is disposed between the lower portion P1 and the middle portion P2.

The lower portion P1 of the air gap AG1 is in the middle part MP (dielectric layer 36) of the dielectric layer DL. The neck portion n1 of the air gap AG1 is in the stop layer 40. The middle portion P2 of the air gap AG1 is in the upper part HP (dielectric layer 42) of the dielectric layer DL. The top portion TP of the air gap AG1 is in the cap part CP (dielectric layer 62) and the stop layers 44 and 48 of the dielectric layer DL. In this embodiment, the dielectric layer 62 covers or seals the air gap AG1 and therefore defines the top, the sidewall and the bottom of the air gap AG1.

The maximum width of the top portion TP of the air gap AG1 may be less than, equal to or greater than the maximum width of the neck portion n1. Each of the maximum width of the middle portion P2 and the lower portion P1 of the air gap AG1 is greater than the maximum width of the neck portion n1 or the top portion TP of the air gap AG1. The maximum width of the lower portion P1 of the air gap AG1 is greater than or equal to the maximum width of the middle portion P2.

In this embodiment, the distance between two adjacent contacts 38 is greater than the distance between two adjacent conductive lines 46. Therefore, the maximum width of the lower portion P1 of the air gap AG1 between the contacts 38 may be greater than the maximum width of the middle portion P2 of the air gap AG1 between the conductive lines 46. The maximum width of the air gap AG1 is greater than or equal to the maximum width of conductive structure CS (e.g., gate structure 32). In some embodiments, the maximum width of the lower portion P1 of the air gap AG1 is greater than the maximum width of the conductive structure CS (e.g., gate structure 32). The maximum width of the middle portion P2 of the air gap AG1 is greater than, equal to or less than the maximum width of the conductive structure CS (e.g., gate structure 32). In some embodiments, the volume of the middle portion P2 of the air gap AG1 may be 30% to 70% of the volume of the region R1 between adjacent conductive lines 46. In some other embodiments, the volume of the middle portion P2 of the air gap AG1 may be 50% to 70% of the volume of the region R1 between adjacent conductive lines 46. In some other embodiments, the volume of the middle portion P2 of the air gap AG1 may be 60% to 70% of the volume of the region R1 between adjacent conductive lines 46. The region R1 indicates a region enclosed by the sidewalls of the adjacent conductive lines 46, the bottom surface of the stop layer 44 and the top surface of the stop layer 40. The maximum width of the top portion TP of the air gap AG1 is less than the maximum width of the conductive structure CS (e.g., gate structure 32).

Figure 3:
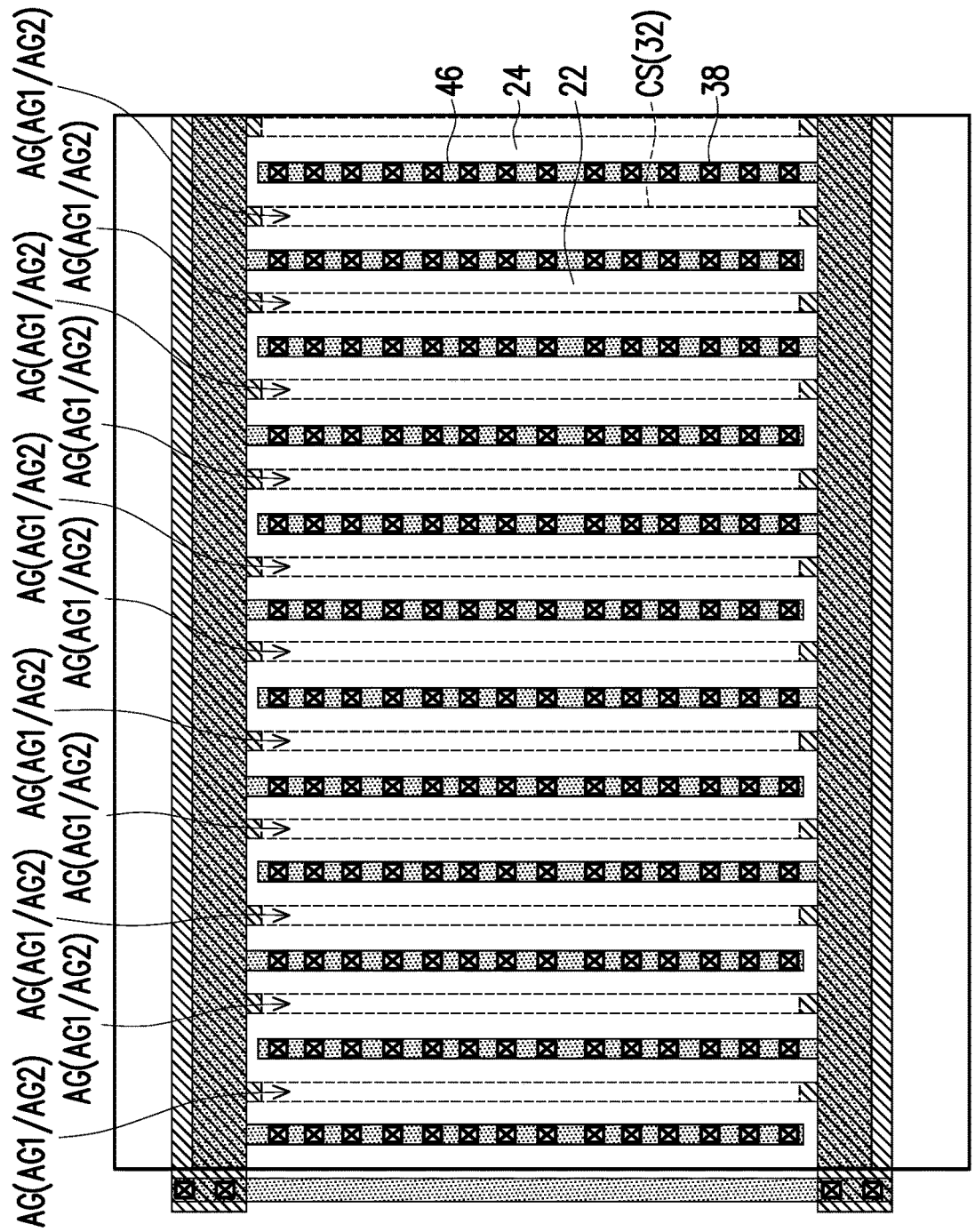
FIG. 3 is a top view of a semiconductor device according to an embodiment of the present disclosure.

FIG. 3 is a top view of a semiconductor device according to an embodiment of the present disclosure.

Referring to FIG. 3, from a top view, air gaps AG (e.g., air gaps AG1) are in the shape of strips, the extension direction of the air gaps AG (e.g., air gaps AG1) is parallel to the extension direction of the conductive structures CS (e.g., gate structures 32), and the locations of the air gaps AG (e.g., air gaps AG1) are overlapped with the locations of the conductive structures CS (e.g., gate structures 32).

Referring to FIG. 1G, in an embodiment of the present disclosure, the semiconductor device 100A further includes a liner layer 60. The liner layer 60 covers and surrounds the middle portion P2 of the air gap AG1 and covers the sidewall of the upper part HP (dielectric layer 42) of the dielectric layer DL. In this embodiment, the liner layer 60 is formed between the upper part HP (dielectric layer 42) of the dielectric layer DL and the dielectric layer 62 extending around the middle portion P2 of the air gap AG1. The liner layer 60 is not formed in other layers of the dielectric layer DL other than the dielectric layer 42. Specifically, the liner layer 60 is not formed on the sidewalls of the stop layers 40, 44 and 48. The material of the liner layer 60 is different from that of the dielectric layer 42, and different from that of the dielectric layer 62. In some embodiments, each of the dielectric layer 42 and the dielectric layer 62 includes a low-k material, and the liner layer 60 includes an oxidized low-k material, such as silicon oxide. Viewed from the cross section, the shape of the liner layer 60 may be arc-shaped, but the present disclosure is not limited thereto.

Due to different process conditions, the liner layer 60 may have various structures. For example, the liner layer 60 may have a uniform thickness or a non-uniform thickness. The liner layer 60 may be a continuous layer or a discontinuous layer. The height of the top end E2 of the liner layer 60 may be the same as or different from the height of the top surface of the dielectric layer 42. The height of the bottom end E1 of the liner layer 60 may be the same as or different from the height of the bottom surface of the dielectric layer 42.

In some embodiments, the top end E2 of the liner layer 60 may be connected to the stop layer 44, and the bottom end E1 may be connected to the stop layer 40, as shown in FIG. 1G. In other embodiments, the top end E2 of the liner layer 60 is connected to the stop layer 44, while the bottom end E1 is not connected to the stop layer 40. In yet other embodiments, the top end E2 of the liner layer 60 is not connected to the stop layer 44, while the bottom end E1 is connected to the stop layer 40. In some other embodiments, the top end E2 of the liner layer 60 is not connected to the stop layer 44, and the bottom end E1 is not connected to the stop layer 40 either.

Figure 2:
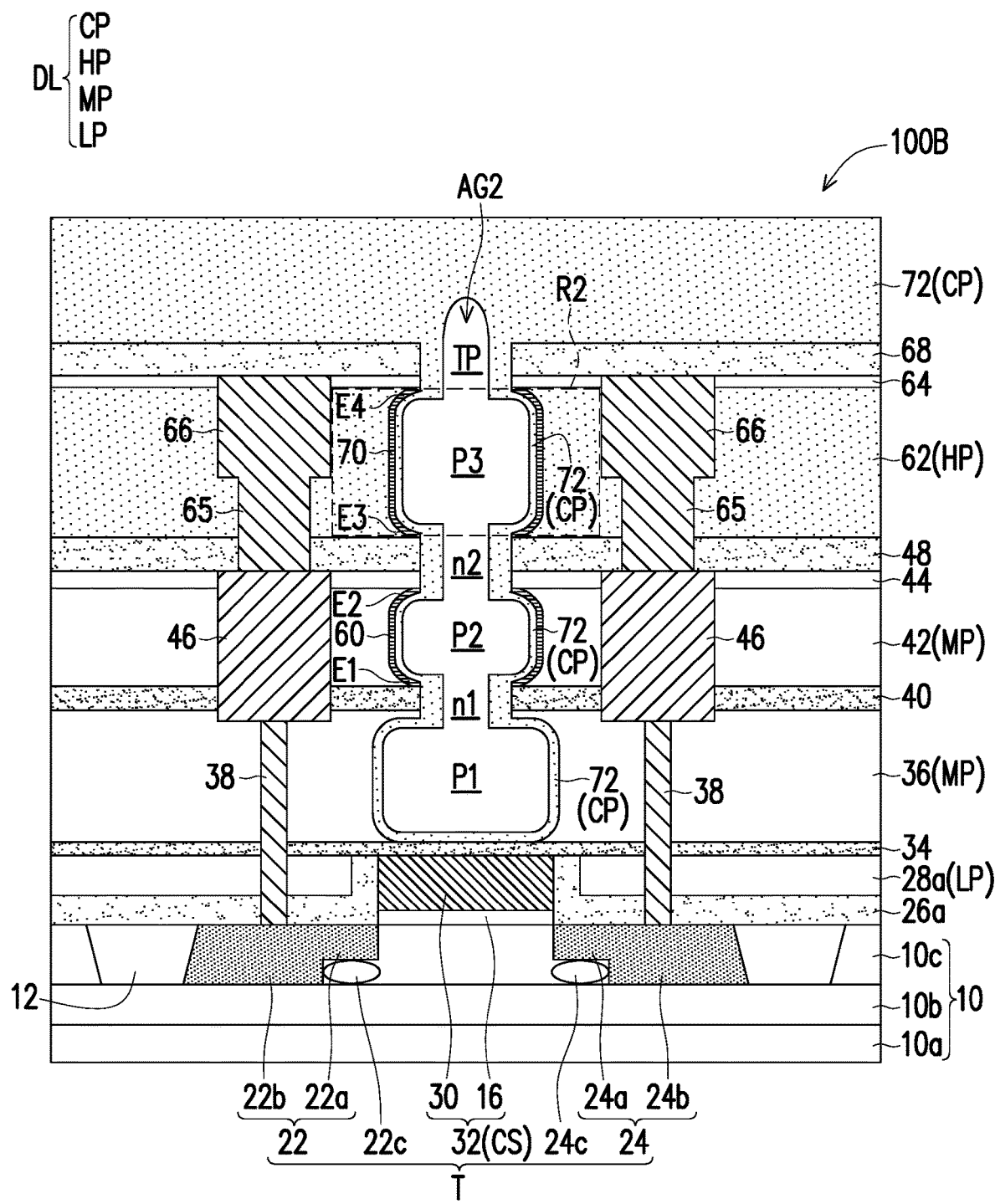
FIG. 2 is a schematic cross-sectional view of a semiconductor device according to another embodiment of the present disclosure.

FIG. 2 is a schematic cross-sectional view of a semiconductor device according to another embodiment of the present disclosure.

Referring to FIG. 2, an embodiment of the present disclosure provides a semiconductor device 100B, which is similar in structure to the above-mentioned semiconductor device 100A, but the dielectric layer 62 of the dielectric layer DL of the metal interconnection structure is further covered by a dielectric layer 72 and stop layers 68 and 64. In addition, the air gap AG2 in the dielectric layer DL is different from the above-mentioned air gap AG1. The dielectric layer 72 includes a low dielectric constant material layer or an ultra-low dielectric constant material layer, such as an organic material containing silicon. The low dielectric constant material is a material with a dielectric constant lower than 4. The ultra-low dielectric constant material is a material with a dielectric constant lower than that of the low dielectric constant material. The material of the dielectric layer 72 may include fluorine-doped silicon glass (FSG); silsesquioxides such as hydrogen silsesquioxnane (HSQ), methyl silsesquioxane (MSQ) and hybrido organo siloxane polymer (HOSP); aromatic hydrocarbon such as SiLK; organosilicate glass such as black diamond (BD), 3MS, 4MS; parylene; fluoro-polymer such as PFCB, CYTOP, Teflon; poly(arylethers) such as PAE-2, WIDEN; porous polymer such as XLK, Nanofoam, Awrogel; Coral, etc. Each of the stop layers 68 and 64 may include silicon nitride, silicon oxynitride, silicon carbide (SiC), silicon carbonitride (SiCN), aluminum oxide, nitrogen doped SiC (NDC) or a combination thereof. In some embodiments, the material of the stop layer 64 includes silicon oxynitride, and the material of the stop layer 68 includes nitrogen-doped SiC (NDC).

Referring to FIG. 2, the air gap AG2 is in the shape of a multi-knotted gourd or a multi-section gourd. The air gap AG2 includes a lower portion P1, a neck portion n1, a middle portion P2, a neck portion n2, an upper portion P3 and a top portion TP. The middle portion P2 of the air gap AG2 is between the lower portion P1 and the upper portion P2. The upper portion P3 of the air gap AG2 is between the middle portion P2 and the top portion TP. The neck portion n1 of the air gap AG2 is between the lower portion P1 and the upper portion P2. The neck portion n2 of the air gap AG2 is between the middle portion P2 and the upper portion P3.

The lower portion P1 of the air gap AG2 is in the middle part MP (dielectric layer 36) of the dielectric layer DL. The neck portion n1 of the air gap AG2 is in the stop layer 40. The middle portion P2 of the air gap AG2 is in the middle part MP (dielectric layer 42) of the dielectric layer DL. The neck portion n2 of the air gap AG2 is in the stop layers 44 and 48. The upper portion P3 of the air gap AG2 is in the upper part HP (dielectric layer 62) of the dielectric layer DL. The top portion TP of the air gap AG2 is in the cap part CP (dielectric layer 72) and the stop layers 64 and 68 of the dielectric layer DL. In this embodiment, the dielectric layer 72 covers or seals the air gap AG2 and therefore defines the top, the sidewall and at least a portion of the bottom of the air gap AG2. The bottom of the air gap AG2 may expose the stop layer 34.

The maximum width of the top portion TP of the air gap AG2 may be less than or greater than the maximum width of the neck portions n1 and n2. The maximum width of upper portion P3, the middle portion P2 and the lower portion P1 of the air gap AG2 is greater than the maximum width of the neck portions n1 and n2 and the top portion TP of the air gap AG2. The maximum width of the lower portion P1 of the air gap AG2 may be greater than or equal to the maximum width of the middle portion P2 and the upper portion P3. The maximum width of the middle portion P2 of the air gap AG2 is greater than, equal to or less than the maximum width of the upper portion P3 of the air gap AG2.

In this embodiment, the distance between two adjacent contacts 38 is greater than the distance between two adjacent conductive lines 46 and greater than the distance between two adjacent conductive lines 66. Therefore, the maximum width of the lower portion P1 of the air gap AG2 between the contacts 38 may be greater than the maximum width of the middle portion P2 of the air gap AG2 between the conductive lines 46, and greater than the maximum width of the upper portion P3 of the air gap AG2 between the conductive lines 66. The maximum width of the air gap AG2 is greater than or equal to the maximum width of conductive structure CS (e.g., gate structure 32). In some embodiments, the maximum width of the lower portion P1 of the air gap AG2 is greater than the maximum width of the conductive structure CS (e.g., the gate structure 32). The maximum width of the middle portion P2 of the air gap AG2 is greater than, equal to or less than the maximum width of the conductive structure CS (e.g., gate structure 32). The maximum width of the upper portion P3 of the air gap AG2 is greater than, equal to or less than the maximum width of the conductive structure CS (e.g., gate structure 32).

In some embodiments, the volume of the upper portion P3 of the air gap AG2 may be 30% to 70% of the volume of the region R2 between adjacent conductive lines 66. In some other embodiments, the upper portion P3 of the air gap air gap AG2 may be 50% to 70% of the volume of the region R2 between adjacent conductive lines 66. In some other embodiments, the upper portion P3 of the air gap AG2 may be 60% to 70% of the volume of the region R2 between adjacent conductive lines 66. The region R2 indicates a space enclosed by the sidewalls of the adjacent conductive line 66 extending downward, the bottom surface of the stop layer 64 and the top surface of the stop layer 48. The maximum width of the top portion TP of the air gap AG2 is less than the maximum width of the conductive structure CS (e.g., gate structure 32).

Referring to FIG. 3, from a top view, air gaps AG (e.g., air gaps AG2) are in the shape of strips, the extension direction of the air gaps AG (e.g., air gaps AG2) is parallel to the extension direction of the conductive structures CS (e.g., gate structures 32), and the locations of the air gaps AG (e.g., air gaps AG2) are overlapped with the locations of the conductive structures CS (e.g., gate structures 32).

Referring to FIG. 2, in an embodiment of the present disclosure, the semiconductor device 100B further includes liner layers 60 and 70.

The liner layer 70 covers and surrounds the upper portion P3 of the air gap AG2 and covers the sidewall of the upper part HP (dielectric layer 62) of the dielectric layer DL. In this embodiment, the liner layer 70 is located between the upper part HP (dielectric layer 62) of the dielectric layer DL and the dielectric layer 72 extending around the upper portion P3 of the air gap AG2.

The liner layer 60 covers and surrounds the sidewall of the middle portion P2 of the air gap AG2 and covers the sidewall of the middle part MP (dielectric layer 42) of the dielectric layer DL. In this embodiment, the liner layer 60 is formed between the middle part MP (dielectric layer 42) of the dielectric layer DL and the dielectric layer 72 extending around the middle portion P2 of the air gap AG2.

The liner layers 60 and 70 are not formed in other layers of the dielectric layer DL other than the dielectric layers 42 and 62. Specifically, the liner layers 60 and 70 are not formed on the sidewalls of the stop layers 40, 44, 48, 64 and 68. The liner layers 60 and 70 are not connected to each other, and are separated from each other by the stop layers 44 and 48.

The material of the liner layers 60 and 70 is different from the material of the dielectric layers 42 and 62, and different from the material of the dielectric layer 72. In some embodiments, each of the dielectric layers 42, 62 and 72 includes a low dielectric constant material, such as a silicon-containing organic material. Each of the liner layers 60 and 70 includes an oxidized low-k material, such as silicon oxide. Viewed from the cross-section, the shape of the liner layers 60 and 70 may be arc-shaped, but the present disclosure is not limited thereto.

Due to different process conditions, the liner layers 60, 70 may have various structures. The various structures of the liner layer 60 have been described above, and are not iterated herein. The liner layer 70 may have a uniform thickness or a non-uniform thickness. The liner layer 70 may be a continuous layer or a discontinuous layer. The height of the top end E4 of the liner layer 70 may be the same as or different from the height of the top surface of the dielectric layer 62. The height of the bottom end E3 of the liner layer 70 may be the same as or different from the height of the bottom surface of the dielectric layer 62.

In some embodiments, the top end E4 of the liner layer 70 may be connected to the stop layer 64, and the bottom end E3 may be connected to the stop layer 48, as shown in FIG. 2. In other embodiments, the top end E4 of the liner layer 70 is not connected to the stop layer 64, while the bottom end E3 is connected to the stop layer 48. In yet other embodiments, the top end E4 of the liner layer 70 is connected to the stop layer 64, while the bottom end E3 is not connected to the stop layer 48. In some other embodiments, the top end E4 of the liner layer 70 is not connected to the stop layer 64, and the bottom end E3 is not connected to the stop layer 48 either.

FIG. 1A to FIG. 1G are cross-sectional views of a method of fabricating a semiconductor device according to an embodiment of the present disclosure.

Referring to FIG. 1A, a substrate 10 is provided. The substrate 10 may be a semiconductor-on-insulator (SOI) substrate, or a bulk semiconductor substrate (not shown). The semiconductor-on-insulator substrate may include a semiconductor substrate 10a, an insulating layer 10b, and a semiconductor layer 10c. The semiconductor-on-insulator substrate may be a silicon-on-insulator substrate. The semiconductor substrate 10a may be a silicon substrate, the insulating layer 10b may be a silicon oxide layer, and the semiconductor layer 10c may be a silicon layer.

Thereafter, an isolation structure 12 is formed in the substrate 10 to define an active area in the substrate 10. After that, a gate structure 20 is formed on the substrate 10. The gate structure 20 includes a gate dielectric layer 16 and a dummy gate conductive layer 18. The gate dielectric layer 16 may include silicon oxide, silicon nitride, a high dielectric constant material or a combination thereof. The dummy gate conductive layer 18 may include undoped polysilicon or doped polysilicon.

Afterwards, an ion implantation process is performed to form lightly doped regions 22a and 24a in the substrate 10 at two sides of the gate structure 20. In some embodiments, a pocket-type ion implantation process is further performed to form pocket-type doped regions 22c and 24c in the substrate 10 below the lightly doped regions 22a and 24a. Next, a spacer (not shown) is formed on the sidewall of the gate structure 20. The spacer may have a single-layer or multi-layer structure. The material of the spacer may include silicon oxide, silicon nitride or a combination thereof. Afterwards, heavily doped regions 22b and 24b are formed in the substrate 10 at two sides of the spacer and the gate structure 20. The heavily doped region 22b and the lightly doped region 22a form a first doped region 22. The heavily doped region 24b and the lightly doped region 24a form a second doped region 24.

After that, a stop layer 26 and a dielectric layer 28 are formed on the substrate 10. The stop layer 26 covers the spacer and the gate structure 20. The material of the stop layer 26 includes silicon nitride. The dielectric layer 28 is formed on the stop layer 26, and its material includes silicon oxide, such as undoped glass.

Referring to FIG. 1B, a planarization process such as a chemical mechanical polishing process is performed, so as to remove portions of the dielectric layer 28 and the stop layer 26 and therefore expose the dummy gate conductive layer 18.

Referring to FIG. 1C, a gate replacement process is performed to replace dummy gate conductive layer 18 with a gate conductive layer 30. The material of gate conductive layer 30 is different from that of dummy gate conductive layer 18. The material of the gate conductive layer 30 includes metal, metal silicide, metal nitride or a combination thereof. The metal may include tungsten, tantalum, titanium or the like. The metal silicide may include tungsten silicide, titanium silicide or the like. The metal nitride may include tantalum nitride, titanium nitride or the like. For example, the gate conductive layer 30 is formed by performing an etching process to remove the dummy gate conductive layer 18 to form a gate trench (not shown). Next, a gate conductive material is formed on the dielectric layer 28a, and the gate conductive material is filled into the gate trench. Afterwards, a planarization process such as a chemical mechanical polishing process is performed to remove part of the gate conductive material, leaving the gate conductive layer 30 in the gate trench. The top surface of gate conductive layer 30 is coplanar with the top surfaces of dielectric layer 28a and the stop layer 26. The fabrication of transistor T is thus completed. The transistor T includes a gate structure 32, a first doped region 22 and a second doped region 24.

Referring to FIG. 1C, a metal interconnection process is performed. A stop layer 34, a dielectric layer 36, a stop layer 40, a dielectric layer 42 and a stop layer 44 are formed on the substrate 10, and contacts 38 and conductive lines 46 are formed. The contact 38 and the conductive line 46 may be formed by a single damascene process or a dual damascene process. The contacts 38 extend through the dielectric layer 36, the stop layer 34, the dielectric layer 28a, and the stop layer 26a. The conductive lines 46 extend through the stop layer 44, the dielectric layer 42 and the stop layer 40. The conductive lines 46 are respectively electrically connected to the first doped region 22 and the second doped region 24 through the contacts 38. The size of conductive lines 46 is greater than the size of contacts 38. The distance between two adjacent conductive lines 46 is greater than the distance between two adjacent contacts 38. Therefore, the width of the dielectric layer 36 between the contacts 38 is greater than the width of the dielectric layer 42 between the conductive lines 46.

After that, a stop layer 48 is formed on the stop layer 44, the contact 38 and the conductive lines 46.

Referring to FIG. 1D, lithography and etching processes are performed to form a trench OP1. The trench OP1 is located above and overlapped with the gate structure 32, extending from the stop layers 48, 44 through the dielectric layer 42, the stop layer 40 to the dielectric layer 36. The size of the trench OP1 may be less than, equal to or greater than the size of the gate conductive layer 30. The cross-section of the trench OP1 may be rectangular (as shown in FIG. 1D) or trapezoidal (not shown). The etching process may include an anisotropic etching process. The anisotropic etching process may include a dry etching process.

Referring to FIG. 1E, a widening treatment 50 is performed to widen the trench OP1 to form a trench OP2. The widening treatment 50 may be an ex-situ treatment. The widening treatment 50 includes a dry removal method such as a plasma treatment. The gas introduced during the plasma treatment includes an oxygen-containing gas, such as oxygen, $N_2O$ or a combination thereof. The widening treatment 50 has a higher removal rate for the dielectric layer 42 than the stop layers 48, 44, 40 and the dielectric layer 36, and thus, the size of the portion P2' of the trench OP2 at a height of the dielectric layer 42 is widened as much as possible. In some embodiments, the volume of portion P2' may be 30% to 70% of the volume between adjacent conductive lines 46. In other embodiments, the volume of the portion P2' may be 50% to 70% of the volume between adjacent conductive lines 46. In yet other embodiments, the volume of portion P2' may be 60% to 70% of the volume between adjacent conductive lines 46.

In addition, during the widening treatment 50 of the embodiment of the present disclosure, a liner layer 60 is formed on the sidewall of the dielectric layer 42 simultaneously. In some embodiments, the dielectric layer 42 includes a high dielectric constant or an ultra-high dielectric constant material. During the widening treatment 50, the sidewall of the dielectric layer 42 exposed by the trench OP2 is oxidized to form a liner layer 60 containing silicon oxide.

Referring to FIG. 1F, an etching process is performed to remove part of the dielectric layer 36 to deepen and widen the trench OP2 to form a trench OP3. The trench OP3 includes a lower portion P1', a neck portion n1', a middle portion P2', and a neck portion n2'. The etching process may include an isotropic etching process. The isotropic etching process may include a wet etching process, and the used etchant may include hydrofluoric acid. During the etching process for forming the trench OP3, the etching rate of the etchant for the dielectric layer 36 is higher than the etching rate for the stop layer 34 and the liner layer 60. Therefore, the etchant may remove a large amount of the dielectric layer 36 to increase the size and volume of the lower portion P1' as much as possible, and the stop layer 34 and the liner layer 60 may serve as an etch stop layer and an etch-resistant protective layer, respectively. The stop layer 34 as an etch stop layer may prevent the gate conductive layer 30 from being damaged by the etching. The liner layer 60 as an etch-resistant protection layer may reduce the etching of the dielectric layer 42 and therefore prevent the conductive lines 46 from being exposed by the etching.

Referring to FIG. 1G, a dielectric layer 62 is formed on the stop layer 48. In the process of forming the dielectric layer 62, the dielectric layer 62 may be further filled into the trench OP3. When the thickness of the dielectric layer 62 above the stop layer 48 reaches a sufficient thickness, the trench OP3 is sealed to form an air gap AG1. The air gap AG1 includes, from bottom to top, a lower portion P1, a neck portion n1, a middle portion P2 and a top portion TP. The dielectric layer 62 may continuously cover the top, the sidewall and the bottom of the air gap AG1. However, the present disclosure is not limited thereto. The dielectric layer 62 may continuously cover the top, the sidewall and a portion of the bottom of the air gap AG1, and another portion of the stop layer 34 is exposed. The dielectric layer 62 may discontinuously cover the top, the sidewall or the bottom of the air gap AG1. In other words, the sidewall and the bottom of the air gap AG1 may not be completely covered by the dielectric layer 62, but parts of the liner layer 60, the dielectric layer 36 and/or the stop layer 34 are exposed.

In some embodiments, the lower portion P1, the neck portion n1, the middle portion P2 and the top portion TP of the air gap AG1 may be connected to each other. However, in other embodiments, the lower portion P1, the neck portion n1, the middle portion P2 and the top portion TP of the air gap AG1 may be partially connected to each other while partially separated from one another. For example, when the thickness of the dielectric layer 62 filled in the trench OP3 is too thick, it may cause the neck portion n1 to be filled, resulting in the separation of the lower portion P1 and the middle portion P2, while the top portion TP and the middle portion P2 are still connected to each other.

Referring to FIG. 2, in other embodiments, after the stop layer 48 is formed, the above-mentioned patterning process is not performed, but a dielectric layer 62 is formed over the stop layer 48, as shown in FIG. 2. Referring to FIG. 2, after forming the dielectric layer 62, a stop layer 64 is formed on the dielectric layer 62. After that, conductive lines 66 and vias 65 are formed in the stop layer 64 and the dielectric layer 62.

Thereafter, with a method similar to the formation of the trench OP1 described above, a trench (not shown) extending from the stop layer 68 to the dielectric layer 36 is formed. Then, with a method similar to the formation of the air gap AG1 described above, the trench is widened through a widening treatment 50, and then a dielectric layer 72 is formed for sealing, and an air gap AG2 is accordingly formed. During the widening treatment, the dielectric layers 62 and 42 are removed laterally, and at the same time, anti-resistant liner layers 70 and 60 are formed on the sidewalls of the dielectric layer 62 and the dielectric layer 42. The widening treatment may be a plasma treatment. The gas introduced during the plasma treatment includes an oxygen-containing gas, such as oxygen, $N_2O$ or a combination thereof. During the widening treatment, the sidewalls of the dielectric layers 62 and 42 exposed by the trench are oxidized to form liner layers 70 and 60 containing silicon oxide.

During the process of forming the dielectric layer 72, the dielectric layer 72 is further filled in the trench. When the thickness of the dielectric layer 72 above the stop layer 68 reaches a sufficient thickness, the trench is sealed to form an air gap AG2. The air gap AG2 includes, from bottom to top, a lower portion P1, a neck portion n1, a middle portion P2, an upper portion P3, a neck portion n2 and a top portion TP. The dielectric layer 72 may continuously cover the top, the sidewall and the bottom of the air gap AG2. However, the present disclosure is not limited thereto. The dielectric layer 72 may discontinuously cover the top, the sidewall and the bottom of the air gap AG2. In other words, the sidewall and the bottom of the air gap AG2 may not be completely covered by the dielectric layer 72, but parts of the liner layer 60, the dielectric layers 62, 42, 36, the stop layers 40, 34 and/or the stop layer 34 are exposed.

In some embodiments, the lower portion P1, the neck portion n1, the middle portion P2, the neck portion n2, the upper portion P3 and the top portion TP of the air gap AG2 may connected to each other. However, in other embodiments, the lower portion P1, the neck portion n1, the middle portion P2, the neck portion n2, the upper portion P3 and the top portion TP of the air gap AG1 may be partially connected to each other while partially separated from one another. For example, when the thickness of the dielectric layer 72 filled in the trench is too thick, it may cause the neck portion n1 or n2 to be filled, resulting in the separation between the lower portion P1 and the middle portion P2 or the separation between the middle portion P2 and the upper portion P3, The other parts are still connected to each other.

Based on the above, in some embodiments of the present disclosure, an air gap is formed above the conductive structure to reduce the parasitic capacitance. In the manufacturing method of forming a semiconductor device of the disclosure, during the process of forming an air gap, a widening treatment may be performed and a liner layer may be formed on the sidewall of the dielectric layer. During the subsequent process of deepening and enlarging the air gap, such liner layer may prevent the dielectric layer from being laterally over-etched and therefore prevent the contact from being exposed by the etching. The manufacturing method of the semiconductor device of an embodiment of the present disclosure may be integrated with the existing processes, and may be implemented to significantly increase a volume of the air gap and therefore effectively reduce the parasitic capacitance.

Although the present disclosure has been disclosed above with the embodiments, it is not intended to limit the present disclosure. Anyone with ordinary knowledge in the technical field may make some changes and modifications without departing from the spirit and scope of the present disclosure. The scope of protection of the present disclosure should be defined by the scope of the appended patent application.

What is claimed is:

1. A semiconductor device, comprising:
    a conductive structure, disposed on a substrate;
    a first dielectric layer, covering the conductive structure and the substrate;
    a second dielectric layer, disposed on the first dielectric layer, wherein an air gap is present in the first dielectric layer and the second dielectric layer, and is located above the conductive structure; and
    a liner layer covering and surrounding a middle portion of the air gap,
    wherein the first dielectric layer comprises a lower part, a middle part and an upper part, and the air gap is present in the upper part and the middle part of the first dielectric layer and in the second dielectric layer, and
    wherein a top surface of the lower part of the first dielectric layer is coplanar with a top surface of the conductive structure.

2. The semiconductor device according to claim 1, wherein the liner layer comprises silicon oxide.

3. The semiconductor device according to claim 1, wherein the conductive structure comprises a gate structure.

4. The semiconductor device according to claim 1, further comprising:
    a first stop layer, disposed between the substrate and the lower part of the first dielectric layer;
    a second stop layer, disposed between the lower part and the middle part of the first dielectric layer;
    a third stop layer, disposed between the middle part and the upper part of the first dielectric layer; and
    a fourth stop layer, disposed between the upper part of the first dielectric layer and the second dielectric layer.

5. The semiconductor device according to claim 1, wherein the lower part and the middle part of the first dielectric layer comprise undoped glass, and the upper part of the first dielectric layer and the second dielectric layer comprise a low dielectric constant material.

6. The semiconductor device according to claim 1, wherein a maximum width of the air gap in the middle part of the dielectric layer is greater than a width of the conductive structure.

7. The semiconductor device according to claim 1, wherein a maximum width in a lower portion of the air gap is greater than a width of the conductive structure.

8. The semiconductor device according to claim 1, wherein the second dielectric layer covers a top of the air gap, and extends to cover a sidewall and a bottom of the air gap.

* * * * *